(12) United States Patent
Tamai

(10) Patent No.: US 7,018,065 B2
(45) Date of Patent: Mar. 28, 2006

(54) LIGHT-EMITTING DIODE LIGHT SOURCE UNIT

(75) Inventor: Masayuki Tamai, Wakayama (JP)

(73) Assignee: Noritsu Koki Co., Ltd., Wakayama (JP)

( * ) Notice: Subject to any disclaimer, the term of this patent is extended or adjusted under 35 U.S.C. 154(b) by 42 days.

(21) Appl. No.: 10/789,089

(22) Filed: Feb. 27, 2004

(65) Prior Publication Data

US 2004/0170019 A1    Sep. 2, 2004

(30) Foreign Application Priority Data

Feb. 28, 2003  (JP)  ............................. 2003-052632

(51) Int. Cl.
*F21V 7/00*  (2006.01)

(52) U.S. Cl. ....................... 362/247; 362/227; 362/249

(58) Field of Classification Search ................ 362/247, 362/227, 231, 235, 249, 800
See application file for complete search history.

(56) References Cited

U.S. PATENT DOCUMENTS

| 6,351,594 | B1* | 2/2002 | Nakamura et al. .......... 385/146 |
| 6,679,618 | B1* | 1/2004 | Suckow et al. ............. 362/247 |
| 6,851,831 | B1* | 2/2005 | Karlicek, Jr. ............... 362/249 |

FOREIGN PATENT DOCUMENTS

| JP | 05/029665 | 2/1993 |
| JP | 06-291939 | 10/1994 |

\* cited by examiner

*Primary Examiner*—John Anthony Ward
*Assistant Examiner*—Mark Tsidulko
(74) *Attorney, Agent, or Firm*—Fulbright & Jaworski LLP

(57) ABSTRACT

A light-emitting diode (LED) light source unit includes a printed circuit board mounting LED elements thereon. The LED elements are arranged in the form of an array and mounted on a bottom face of a straight groove defined in the printed circuit board by a groove forming technique. A lateral face of the groove acts as a reflecting face for reflecting beam from the LED elements toward an object to be illuminated.

3 Claims, 10 Drawing Sheets

FIG.9
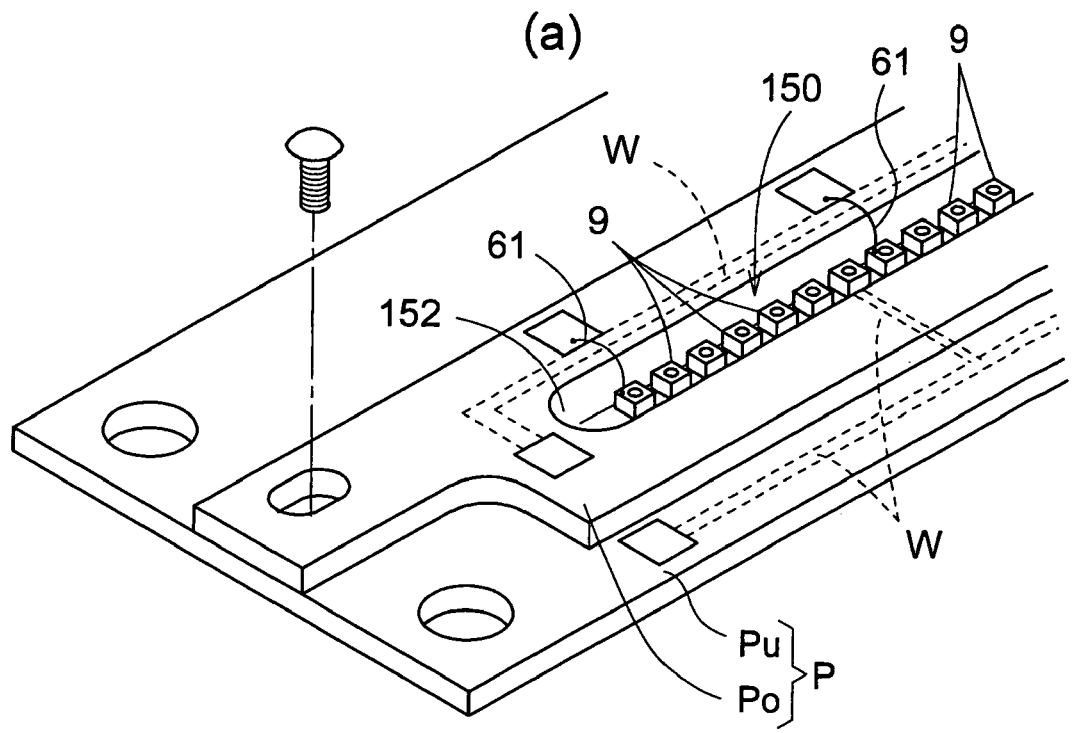
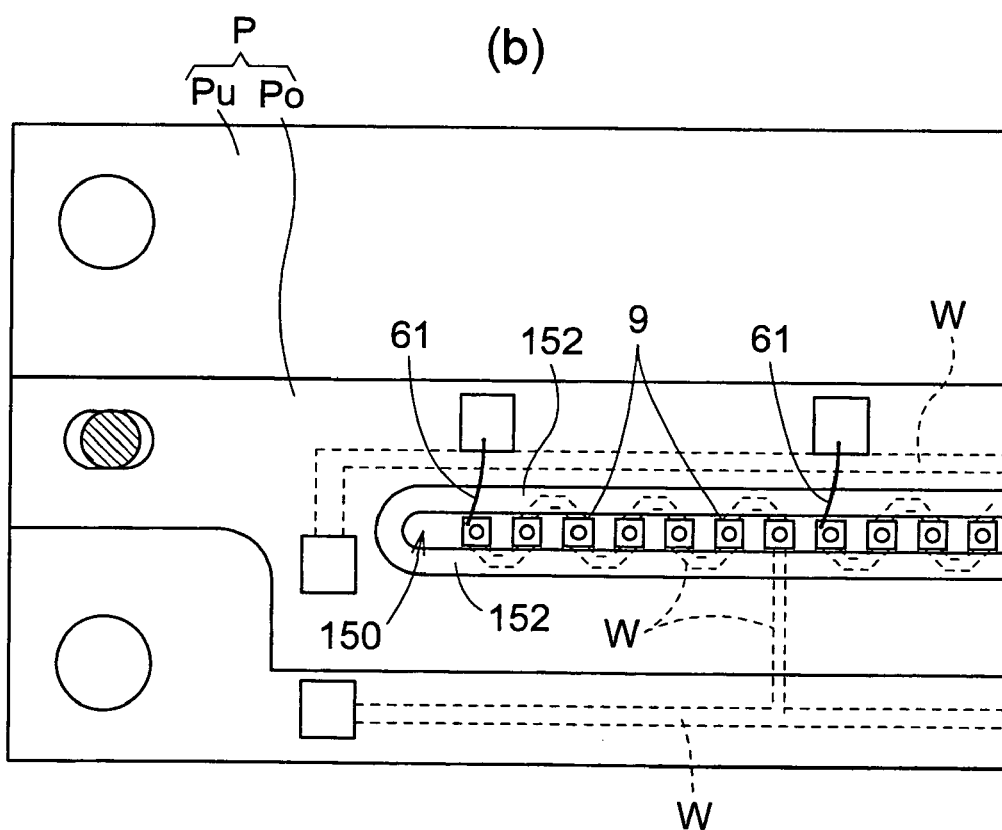

LIGHT-EMITTING DIODE LIGHT SOURCE UNIT

FIELD OF THE INVENTION

The present invention relates to a light-emitting diode light source unit including a printed circuit board mounting light-emitting diode elements.

BACKGROUND OF THE INVENTION

A light-emitting diode light source unit described above is employed as a light source for a facsimile machine, a scanner, etc. This unit has undergone various geometrical optics improvements for obtaining higher illumination intensity available therefrom. For instance, in the case of a light-emitting diode light source known from the Japanese Patent Application "Kokai" No.: Hei. 5-029665 (see paragraphs 0010–0013 and FIG. 2 thereof in particular), on a circuit board, there are arranged, in the form of an array, a plurality of light-emitting diode (LED) elements spaced apart along the length of the board and white resin portions are formed adjacent opposed ends of the array of the LED elements and a transparent resin portion is formed between the opposed white resin portions. Each LED element is die-bonded to a circuit pattern portion of the board, with a top face of the element being wire-bonded to the pattern portion of the board. For forming the white resin portion, there is prepared a semi-liquid material having a high viscosity and a high solidifying speed by mixing a transparent resin material with a white pigment. The two white resin portions are formed by applying this semi-liquid material to the respective positions adjacent the opposed ends of the LED elements array in the form of convex portions progressively raised along the longitudinal direction of the board (i.e. portions having a semi-oval cross section) and then heating the applied material for its solidification. In this, one of the white resin portions is to cover certain portions of the wire bonding and the entire circuit pattern for their protection. A beam emitted from a lateral face of the LED element is reflected by the white resin portion and this reflected beam is then refracted through an interface between the transparent resin portion and ambient air so as to be focused at a position above the LED element.

Another conventional LED light source unit is known from the Japanese Patent Application "Kokai" No. : Hei. 6-291939 (see paragraphs 0029–0030 and FIG. 3 thereof in particular). In this unit, a circuit board mounting thereof a linear array of LED elements is mounted on a resin mount. A portion of this mount extends to the LED mounting surface of the circuit board, with leading ends thereof reaching opposed ends of the LED array, where there are formed inclined faces flared open in a document scanning direction. This inclined face has a surface with a mirror finish, thus forming a reflecting face for the beam emitted from the LED. This beam reflecting face serves for obtaining higher illumination intensity by reflecting the beam emitted from the lateral or front face of the LED element.

In the case of the former-described patent application publication, the white resin portion acting as a "reflector" is formed by applying the material directly to the printed circuit board. Hence, irregularity tends to occur in the spacing relative to each LED element and/or the shape of the reflecting face and such irregularity may invite irregularity in the illumination intensity of the LED array.

In the case of the latter-described patent application publication, the mount including the reflector is designed to hold and support the entire printed circuit board. Hence, this construction results in disadvantageous enlargement of the entire LED light source unit, which makes its application difficult for an optical system imposing a significant space limitation.

SUMMARY OF THE INVENTION

In view of the above-described state of the art, a primary object of the present invention is to provide a light-emitting diode light source unit having a reflecting face shape realized without its irregularity in the extending direction of the LED element array and without requiring any special separate member for forming the reflector.

For accomplishing the above-noted object, according to the present invention, there is provided a light-emitting diode light source unit having a printed circuit board mounting a plurality of light-emitting diode elements, wherein the plurality of light-emitting diode elements are arranged in the form of an array on a bottom face of a straight groove formed in the printed circuit board by a groove-forming technique, a lateral face of the groove acting as a reflecting face for reflecting a beam from said each light-emitting diode element toward an object to be illuminated.

With this construction, by the groove forming technique, a groove is formed in the printed circuit board constituting the light-emitting diode light source unit. And, a bottom face of this groove serves as a mounting face for mounting the LED elements and a lateral face of the groove serves as a reflecting face disposed laterally of the mounted LED elements for reflecting the beam from the LED elements toward an object to the illuminated. Hence, by implementing an appropriate groove forming technique favorable for obtaining high surface precision, a reflecting face having good reflecting property can be formed with precision along the array of the plurality of LED elements disposed linearly. As a result, the illumination intensity irregularity of the entire LED array due to the irregularity in the reflecting face may be effectively restricted. Further, with the above construction, the reflecting face can be easily formed by only forming the groove in an area of the printed circuit board where the array of LED elements is to be mounted. Thus, this construction eliminates any special separate reflector, thereby to allow the entire construction compact.

As described above, the lateral face of the groove within which the LED elements are mounted serves as the reflecting face for the LED elements. Therefore, the present invention proposes some particularly advantageous groove shapes all providing a superior reflecting property to that of a simple groove having a rectangular cross section. One example thereof is to form the lateral face of the groove as an inclined face flared open upward from the bottom face of the groove. With this construction, the beam emitted laterally of the LED element will be changed in direction toward a front optical axis of the LED element (where a condensing lens will generally be disposed). According to a further preferred groove shape, the lateral face of the groove is formed as a concave curved face flared open from the bottom face. By providing such reflecting curved face laterally of the LED element, the beam emitted from the LED element can be well focused.

It is difficult or costly to form a wiring land (wiring pattern) in the bottom face of the groove formed in the printed circuit board. Hence, it is preferred that the bottom face of the groove be used only as the mounting face for mounting the LED elements. In view of this, according to one preferred embodiment of the present invention, a wiring land for the LED elements formed on the surface of the printed circuit board and the LED elements are connected to each other via bonding wires. The use of this wire bonding technique advantageously eliminates the necessity of forming the printed circuit wiring in the bottom face of the groove.

Depending on the type of LED elements employed, some elements have terminals on the side of the mounting face, thus requiring die bonding for their electrical connection. In such case, it is necessary to form the wiring land (wiring pattern) in the mounting face. Hence, it is difficult to mount the LED elements within the groove formed in the printed circuit board. Then, in the case of a light-emitting diode light source unit using such LED elements requiring die bonding of the wiring connection, in order to solve the above problem, according to the present invention, the printed circuit board includes a first printed circuit board and a second printed circuit board superposed on a top face of the first printed circuit board, and the second printed circuit board defines a straight through groove formed through the thickness thereof by a groove forming technique for exposing an LED element mounting face of the first printed circuit board, which mounting face mounts a plurality of LED elements in the form of an array, a lateral face of the through groove acting as a reflecting face for reflecting a beam from said each light-emitting diode element toward an object to be illuminated.

In the case of the above-described construction, the printed circuit board is provided as double-layered construction and the through groove defined in the upper printed circuit board (second printed circuit board) acts as the reflecting face provided for and disposed laterally of the LED elements mounted on the lower printed circuit board (first printed circuit board). In the case of this construction too, by implementing an appropriate groove forming technique favorable for high surface precision, a reflecting face having good reflecting property can be formed with precision along the array of the plurality of LED elements disposed linearly. As a result, the illumination intensity irregularity of the entire LED array due to the irregularity in the reflecting face may be effectively restricted. Further, as the reflecting face is realized by using the upper printed circuit board of the two-layered printed circuit board assembly, this construction too eliminates any special separate reflector. Incidentally, one terminal of the LED element is connected by means of die bonding with the wiring land formed on the mounting face. If the other terminal is provided on the top face of this LED element, this other terminal can be connected by means of the bonding wire with the wiring land formed on the upper printed circuit board.

In the case of the above-described alternative construction also, for realizing a favorable reflecting face shape, it is proposed that the lateral face of the through groove be formed as an inclined face flared open upward from the LED mounting face or the lateral face of the through groove be formed as a concave curved face flared open from the LED mounting face. With these proposed constructions, the above-described function/effect can be achieved.

Further and other features and advantages of the present invention will become apparent upon reading the following detailed description of preferred embodiments thereof with reference to the accompanying drawings.

BRIEF DESCRIPTION OF THE DRAWINGS

FIG. 9 shows an appearance of a unit relating to a further embodiment after the LED elements are mounted on a printed circuit board.

DETAILED DESCRIPTION OF THE PREFERRED EMBODIMENTS

Figure 1:
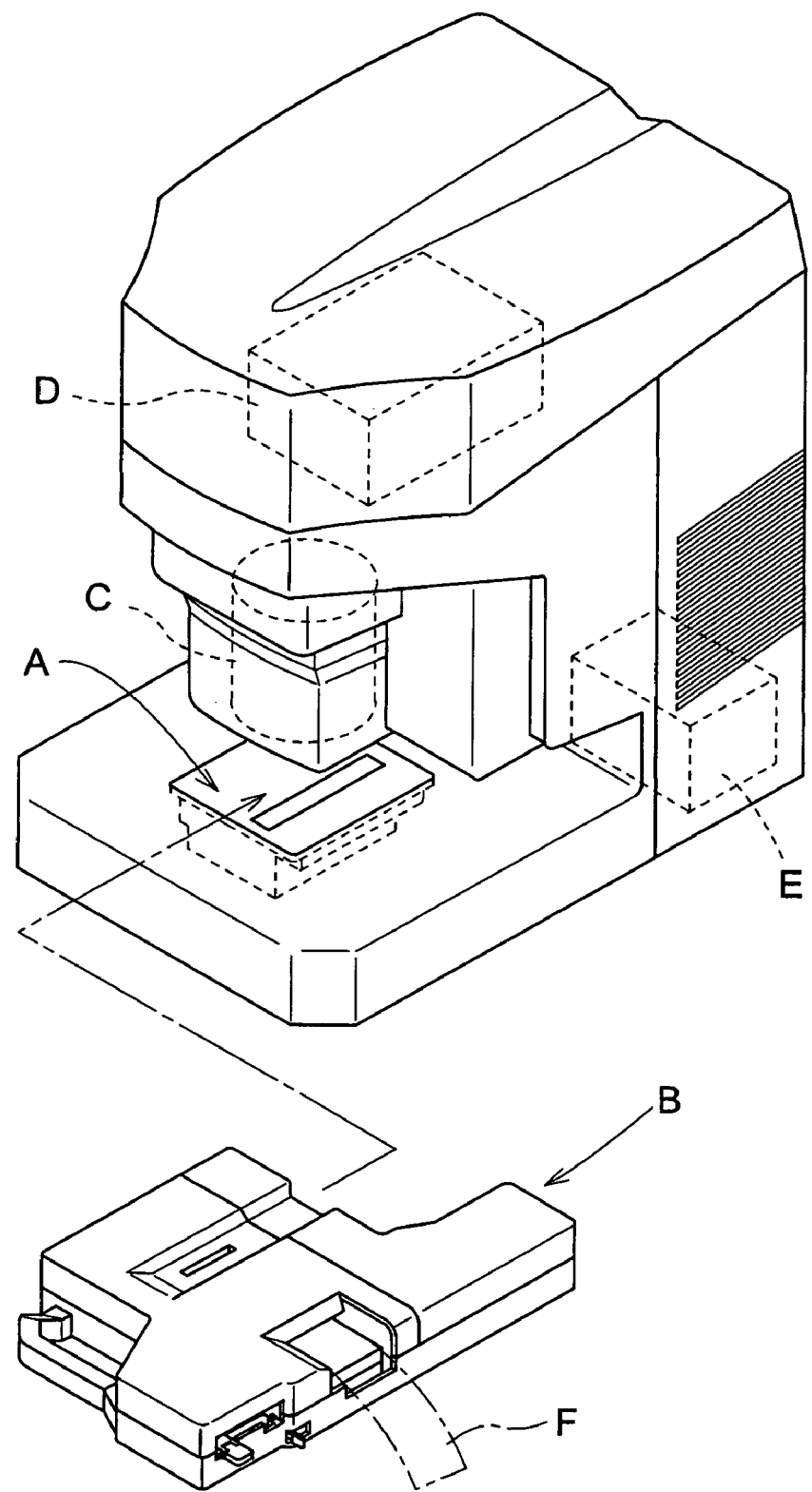
FIG. 1 shows an appearance of a film scanner using a light-emitting diode light source unit of the present invention.

FIG. 1 shows an appearance of a film scanner using a light-emitting diode (LED) light source unit according to the present invention. This film scanner includes a light source unit A, a film carrier unit B, a lens unit C, a photoelectric converter unit D, and a control unit E. In operation, a beam from the light source unit A is irradiated on a developed photographic film F carried on the film carrier B and the transmission beam past this photographic film F is guided by the lens unit C to the photoelectric converter unit D. In this unit D, a CCD (Charge Coupled Device) type line sensor incorporated therein obtains, from an image in the photographic film F, image data in the form of digital signals corresponding to the three primary colors of R (red), G (green) and B (blue) and obtains also, by means of an infrared beam (IR), its beam intensity variable due to presence of a defect or flaw or dust or the like in the photographic film F as image data in the form of digital signals for use in flaw correction.

The light source unit A includes a plurality of light-emitting diode (LED) arrays (representing three kinds of LED arrays described later) each comprising an array of a plurality of LED elements 9 arranged along a main scanning direction for generating the beams of the three primary color components and the infrared beam. The film carrier unit B is designed for transporting the film F back and forth along a sub scanning direction. And, a plurality of film carrier units B are prepared to cope with a plurality of types of photographic films F such as 135 size, 240 size, 120/220 size films, so that these carriers are exchangeable. The lens unit C includes a zooming type optical lens which is operable to cause an image in the photographic film F carried by the film carrier B to be impinged in focus on the CCD type line sensor incorporated in the photoelectric converter unit D, the lens allowing variation of a magnifying power depending on the desired number of pixels to be obtained. The photoelectric converter unit D includes a three-line type CCD line sensor corresponding to the three primary colors of R (red), G (green) and B (blue) and a one-line type CCD line sensor having sensitivity for the infrared beam (IR).

Figure 2:
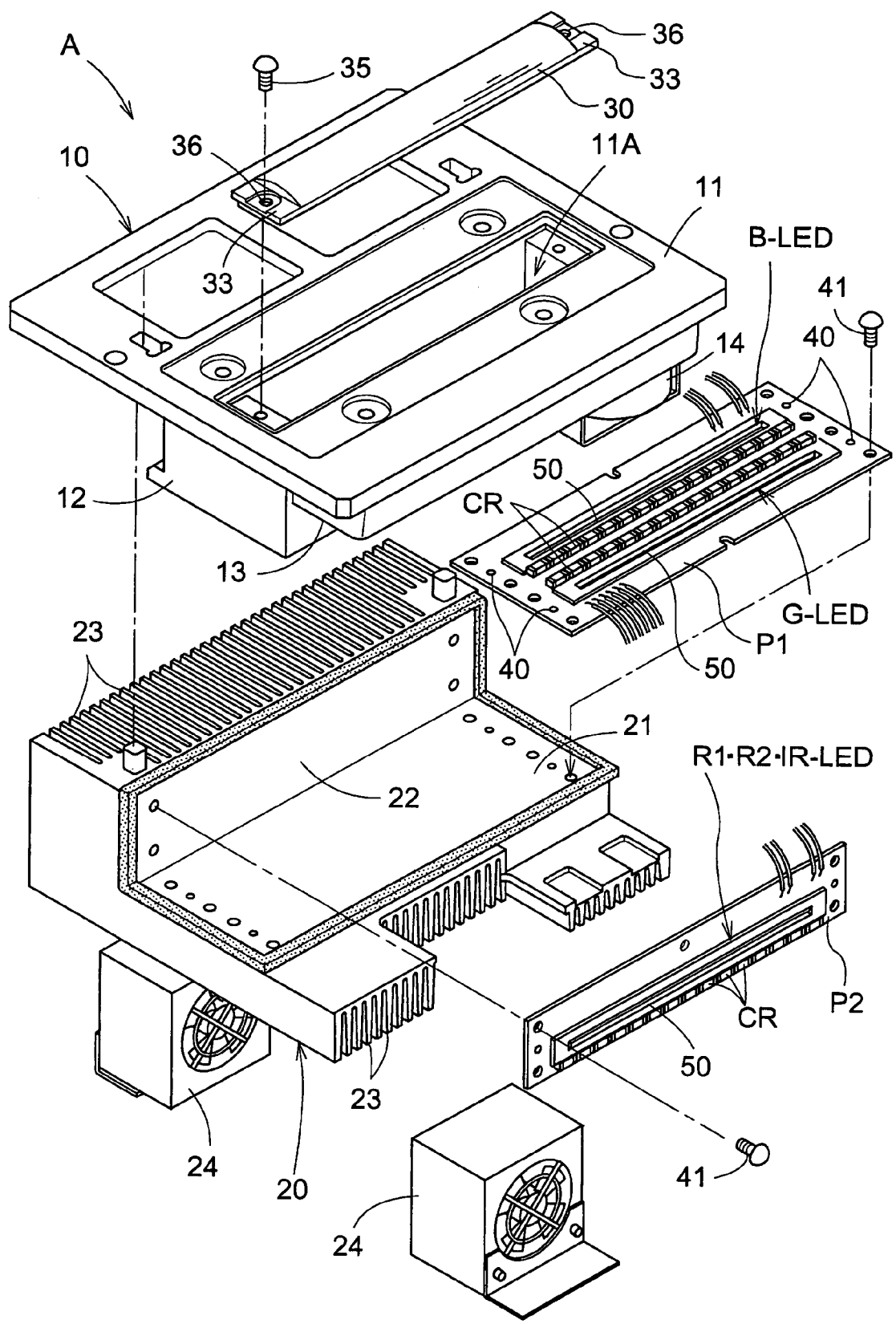
FIG. 2 is an exploded view of the film scanner shown in FIG. 1.
Figure 3:
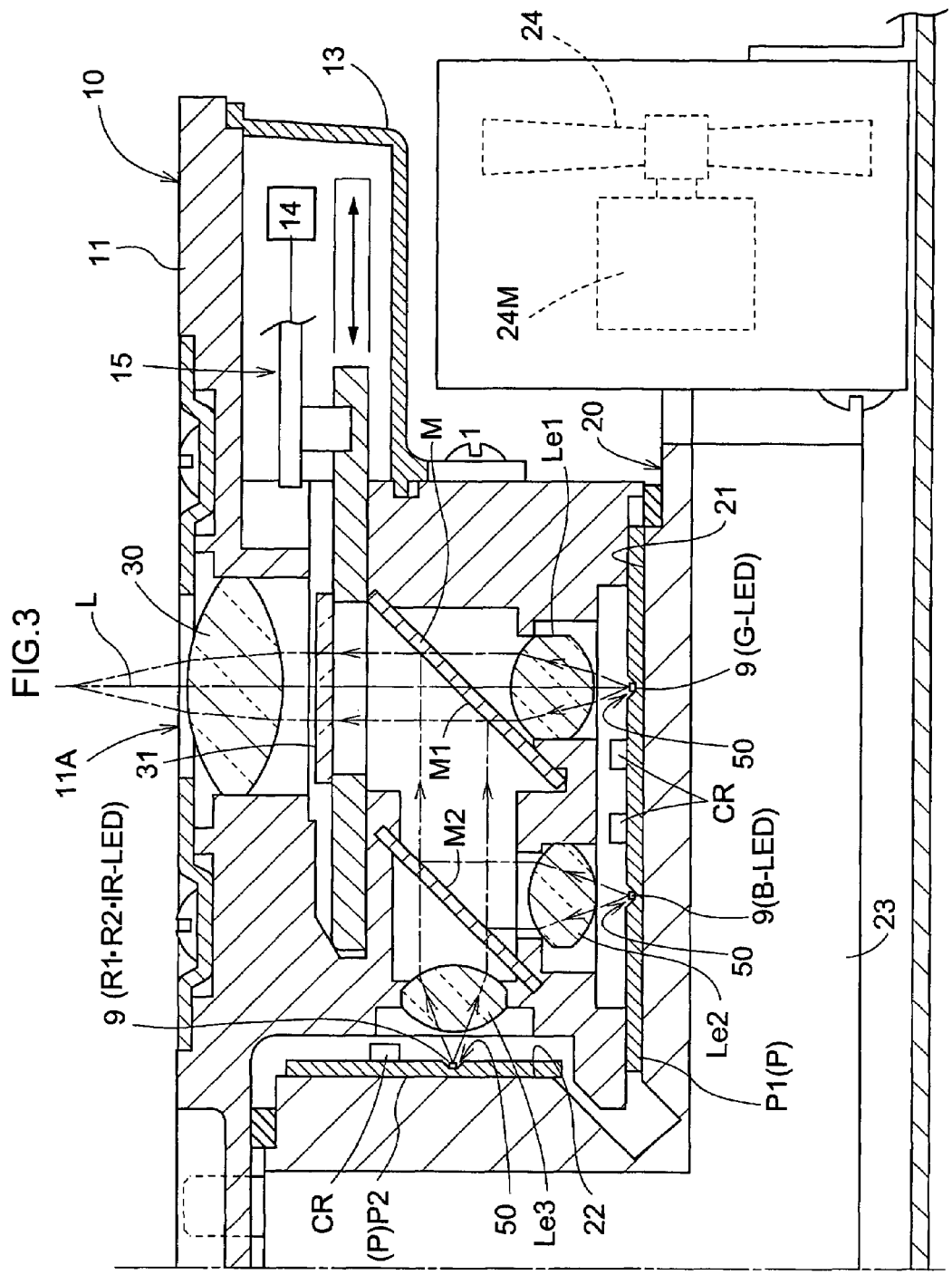
FIG. 3 is a section view of the film scanner shown in FIG. 1.

As shown in FIGS. 2 and 3, the light source unit A includes an upper case 10 formed as resin molded component and a lower case 20 formed of an aluminum alloy. The upper case 10 includes a flat upper table portion 11 and a box portion 12 formed integrally therewith and projecting from the bottom face of the upper table portion 11. Further, a resin cover 13 is provided for a bottom face of the upper table portion 11. The lower case 20 includes a bottom wall portion 21, a lateral wall portion 22 formed integrally therewith and a plurality of fins 23 as heat discharging elements formed integrally with respective outer faces of the bottom wall portion 21 and the lateral wall portion 22. This light source unit A further includes a pair of fans 24 for feeding cooling air to the fins 23.

The upper table portion 11 of the upper case 10 defines an opening 11A of a predetermined width formed along the main scanning direction for irradiating beam upwards. Within this opening 11A, there is provided a cylindrical condensing lens 30 and at a position below this condensing lens 30, there is provided an ND filter 31 movable into and out of the optical axis of the lens. More particularly, this ND filter 31 is mounted to be slidable between a condition (position) where the filter is located downwardly of the condensing lens 30 and a further condition where the filter is retracted inside the cover 13. For realizing this movement, the filter is operably connected with a crank mechanism 15 activated by a drive from an electromagnetic solenoid type actuator 14 having the cover 13. In operation, when this ND filter 31 is located at the position below the main converging lens 30 for adjusting the CCD of the photoelectric converter unit D, the filter reduces the amount of beam from the light source unit A, thus appropriately adjusting the photoelectric converter unit D with an appropriate amount of beam.

Further, the box portion 12 accommodates therein a first mirror M1 of dichroic type disposed at a lower position on an extension of the optical axis L of the condensing lens 30, a first lens Le1 of cylindrical type, a second mirror M2 of dichroic type disposed beside the first mirror M1, a second lens Le2 of cylindrical type for guiding beam to a reflecting side of the second mirror M2 and a third lens Le3 of cylindrical type for guiding the beam to a transmitting side of the second mirror M2.

To the bottom wall portion 21 of the lower case 20, there is mounted a first printed circuit board P1 mounting thereon a light-emitting diode array G-LED consisting of a plurality of chip-type green LED elements 9 linearly arranged along the main scanning direction and a light-emitting diode array B-LED consisting of a plurality of chip-type blue LED elements 9 linearly arranged along the main scanning direction. To the lateral wall portion 22 of the lower case 20, there is mounted a second printed board P2 mounting thereon a light-emitting diode array R1·R2·IR-LED including first red, second red and infrared beam LED elements 9 linearly arranged in the mentioned order along the main scanning direction. Then by assembling the lower case 20 with the upper case 10 by superposing the latter on the former, the green LED array G-LED is disposed at the focal position of the first lens Le1, the blue LED array B-LED is disposed at the focal position of the second lens Le2 and the first red, second red and infrared LED array R1·R·2 IR-LED is disposed at the focal position of the third lens Le3, respectively.

The green LED elements 9 have a wavelength of 400–480 nm, the blue LED elements 9 have a wavelength of 520–560 nm, and the first red LED elements 9 and the second red LED elements 9 have a combined wavelength of 620–750 nm, and the infrared LED elements 9 have a wavelength of 830–950 nm, respectively. The first mirror M1 transmits the beam of the particular wavelength (400–480 nm) from the green LED elements 9 while reflecting beams of any other wavelength. The second mirror M2 transmits the beams of the particular wavelengths (620–750 nm and 830–950 nm) from the first red, second red and infrared LED elements 9 while reflecting the beam from the blue LED elements 9 (520–560 nm).

With the above-described construction, the beams from the green LED array G-LED are rendered into parallel rays through the first lens Le1 and then transmitted through the first mirror M1 to be guided to the condensing lens 30. The beams from the blue LED array B-LED are rendered into parallel rays through the second lens Le2 and reflected first by this second mirror M2 and then reflected by the first mirror M1 to be guided to the condensing lens 30. The beams from the first red, second red and infrared LED array R1·R2·IR-LED are rendered into parallel rays through the third lens Le3 and transmitted through the second mirror M2 and then reflected by the first mirror M1 to be guided to the condensing lens 20. By the function of the condensing lens 30, these rays are condensed at a desired scanning area of the photographic film F carried by the film carrier unit B.

Figure 4:
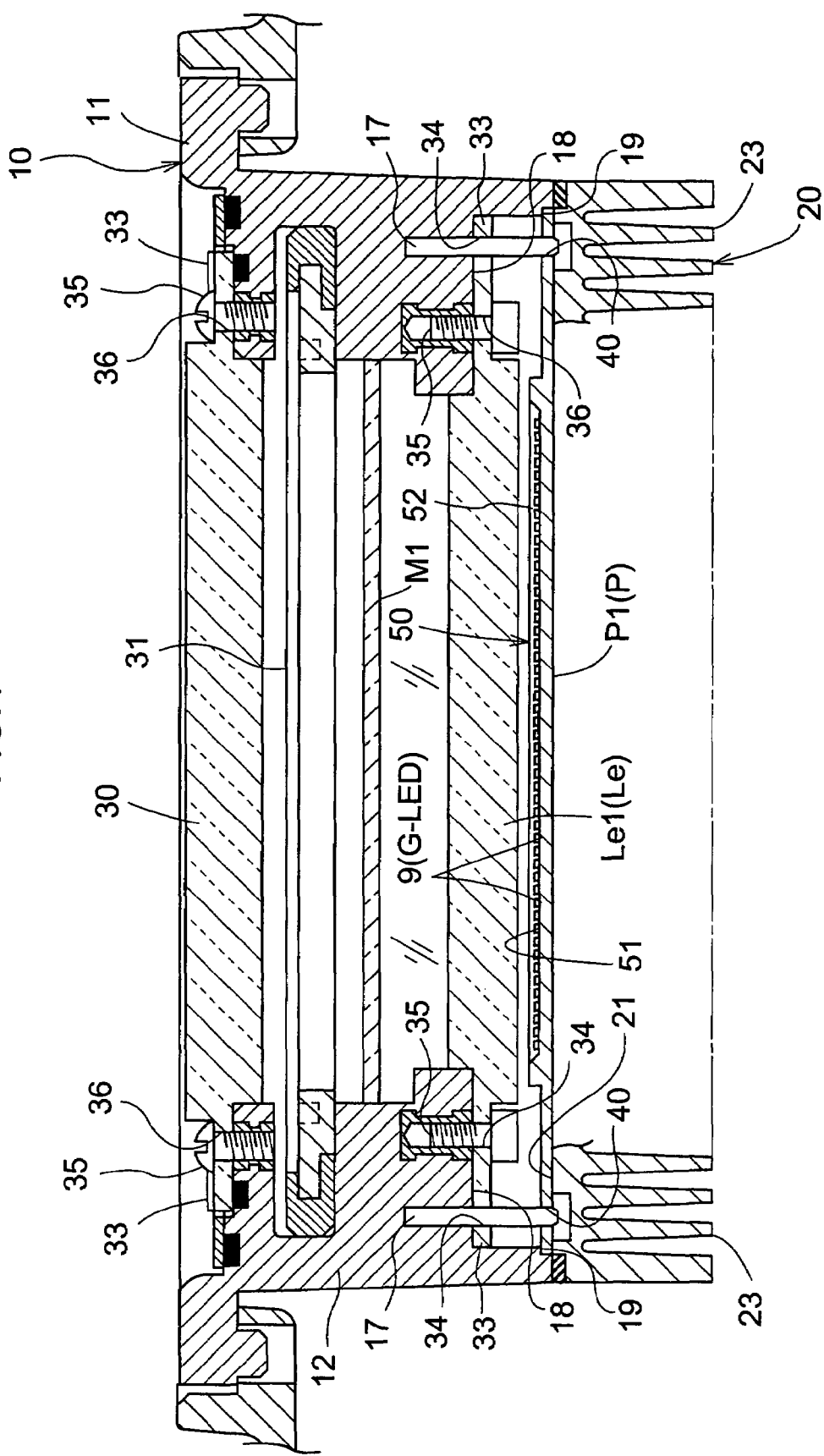
FIG. 4 is an exploded cross section of the light source unit.

As may be apparent from FIG. 4, in order to fixedly determine the focal position of the lens Le (referring generically to the three kinds of lenses described above) corresponding to the LED array LED (generically referring to the three kinds of LED arrays described above) mounted on the printed circuit board P (generically referring to the first printed circuit board P1 and the second printed circuit board P2 described above), positioning pins 17 are provided erect from the box portion 12 of the upper case 10 and positioning faces 18 are formed for coming into contact with the lens Le. Further, at portions of the box portion 12 facing the bottom wall portion 21 and the lateral wall portion 22, there are formed reference faces 19 for coming into contact with the printed circuit board P. At opposed ends of each lens Le (i.e. the first lens Le1, second lens Le2 or third lens Le3), there are integrally formed support pieces 33 for coming into contact with the positioning faces 18, pin holes 34 for engagement with the pins 17 and screw holes 36 through which fixing screws 35 are to be inserted. With the sole difference of not using the positioning pins 17, the construction for supporting the condensing lens 30 to the upper case 10 is identical to that for supporting the lenses Le to the box portion 12. Namely, the screws 35 will be inserted through the screw holes 36 formed in the support pieces 33 formed at the opposed ends of the condensing lens 30 and then the inserted screws will be fixedly threaded with the upper case 10.

The first printed circuit board P1 too defines pin holes 40 for engagement with the positioning pins 17. This first printed circuit board P1 will be fixed to the bottom wall portion 21 by means of screws 41 and the second printed circuit board P2 will be fixed in position to the lateral wall portion 22 by means of the screws 41 (see FIG. 2). Incidentally, in mounting the first and second printed circuit boards P1, P2 to the bottom wall portion 21 and the lateral wall portion 22 respectively, silicon grease is applied to the interfaces thereof for improvement of heat conductivity.

With the above-described construction, when the first, second and third lenses Le1, Le2, Le3 are to be supported to the box portion 12, the pins 17 will be inserted into the pin holes 34 defined in the support pieces 33 formed at the opposed ends of each lens and then under this condition, the screws 35 inserted through the screw holes 36 will be fastened. In this manner, each lens Le1, Le2, Le3 can be supported to the box portion 12 with accuracy. Thereafter, the upper case 10 and the lower case 20 will be connected with each other with superposing the former on the latter. With this, the positioning pins 17 formed on the bottom face of the box portion 12 will engage into the corresponding pin holes 40 of the first printed circuit board P1 supported to the bottom wall portion 21, thereby to fixedly determine the position relative to the first printed circuit board P1 and fixedly determine also the position of the lower case 20 relative to the upper case 10 at the same time. As a result, the position of the third lens Le3 relative to the second printed circuit board P2 too will be fixedly determined as well.

The printed circuit board P uses a relatively thick aluminum substrate 45 as a material having a high heat conductivity. This printed circuit board P includes a groove 50 for disposing therein the chip LED elements 9 in the form of array along the main scanning direction. Further, on the surface of the printed circuit board P, there are mounted a series of chip resistors CR along the extending direction of the groove 50. These chip resistors CR all have a same resistance value and a same size. Heat generated when electric power is supplied to the chip resistors CR is conducted to the printed circuit board P and consequently to the LED elements 9, thereby to realize uniform temperature distribution among the plurality of LED elements 9.

Figure 5:
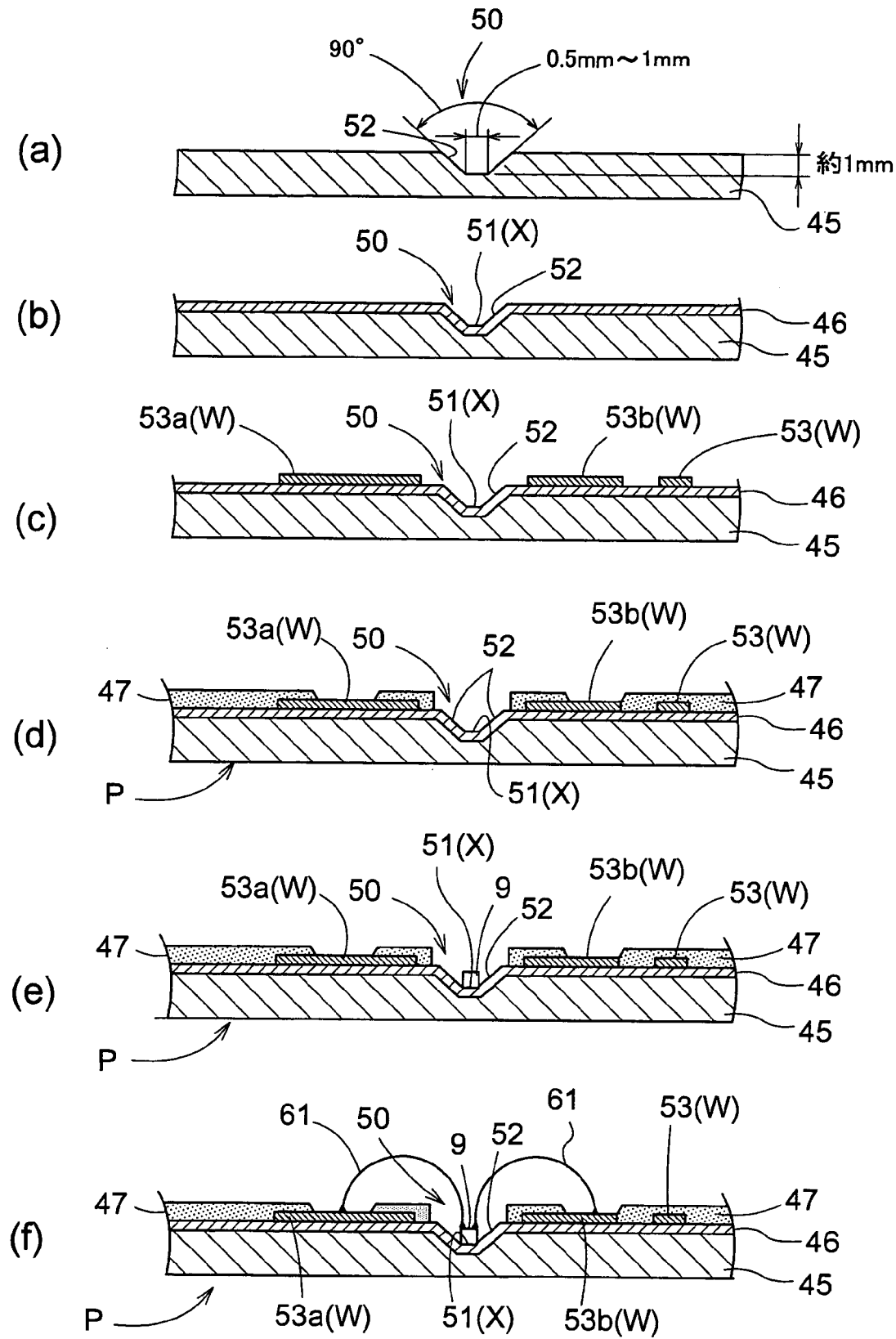
FIG. 5 is a schematic illustrating a process of fabricating the light-emitting diode light source unit of the present invention.

Next, the construction of the printed circuit board P will be described in greater details with reference to FIG. 5. FIG. 5 illustrates a manufacturing process of the printed circuit board P and a process of surface-mounting parts thereon. These processes are only illustrative, not limitative for the present invention.

First, by implementing a groove forming or working technique on the surface of the aluminum substrate 45, there is formed the groove 50 for mounting the LED elements 9 therein, the groove 50 having a depth of about 1 mm, a bottom face 51 having a width of 0.5 mm to 1 mm, and a length corresponding to the length of LED array LED. This groove 50 has an inverse trapezoidal cross section and lateral faces 52 formed as 45-degree inclined faces for forming an upper aperture angle of 90 degrees therebetween (see FIG. 5(*a*)).

In this embodiment, as aluminum is used for forming the substrate 45, an insulating ceramic layer 46 is formed on the surface of the substrate 45 by coating it with a ceramic material (FIG. 5(*b*)). On the top face thereof, a printed circuit wiring W formed of a copper foil or a gold foil, etc. is formed, and on the bottom face 51 of the groove 50, there is formed a surface-mounting pad X (FIG. 5(*c*)). Further, on the top surface of this printed circuit board P except its area where the groove 50 is defined, a resist film 47 formed of an insulating resin is formed (FIG. 5(*d*)).

Then, on the bottom face 51 of the groove 50 formed in the printed circuit board P manufactured as above, the plurality of LED elements 9 are surface-mounted (FIG. 5(*e*)). Lastly, bonding wires are provided between the respective LED elements 9 and the printed circuit wiring W (FIG. 5(*f*)) for establishing electrical connection therebetween. This completes the basic construction of the LED light source unit. Incidentally, for forming the substrate 45, instead of using aluminum, a copper plate or metal alloy may be employed also. Needless to say, a resin material is also usable.

Figure 6:
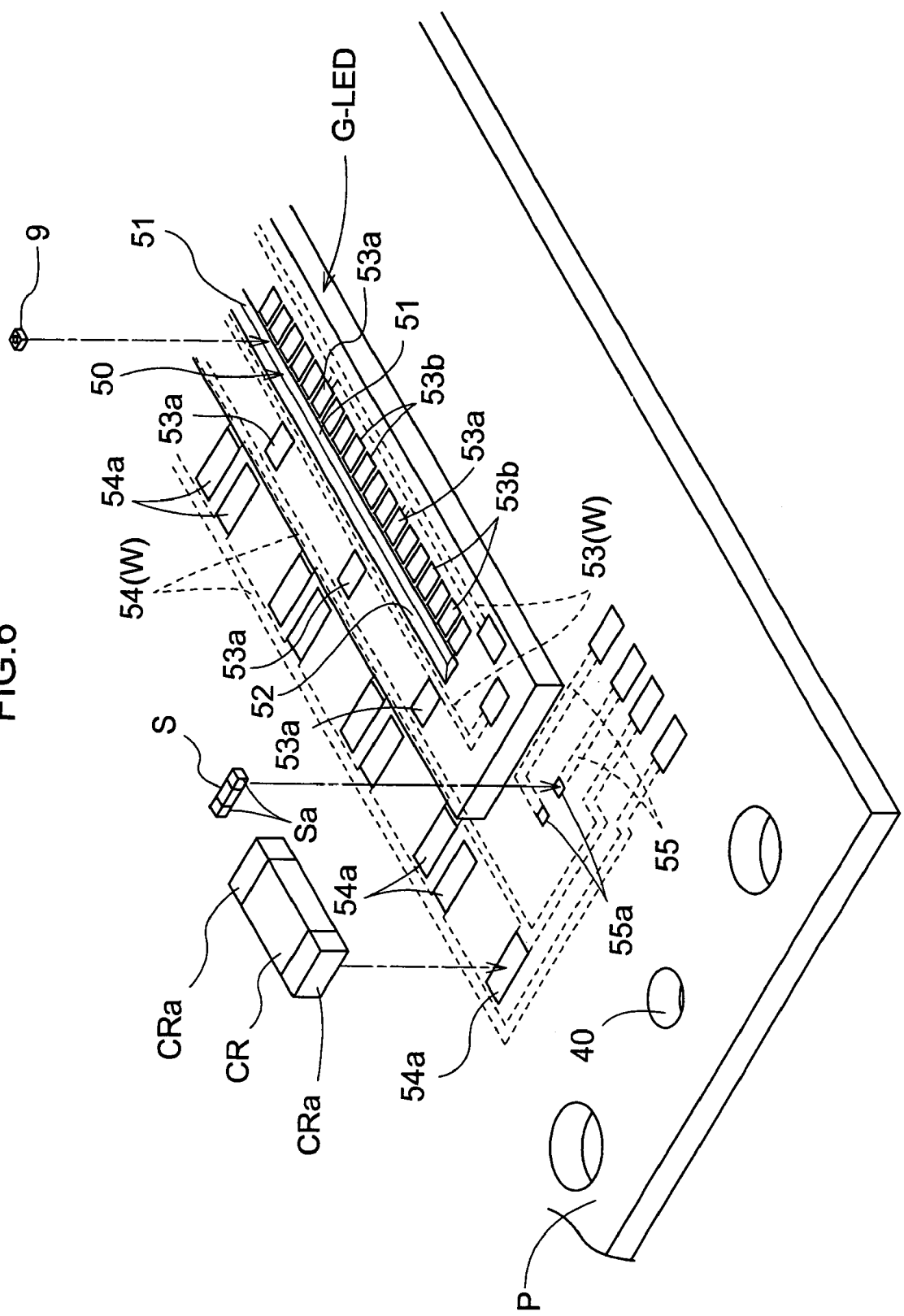
FIG. 6 shows an appearance of the unit before LED elements are mounted on a printed circuit board.
Figure 7:
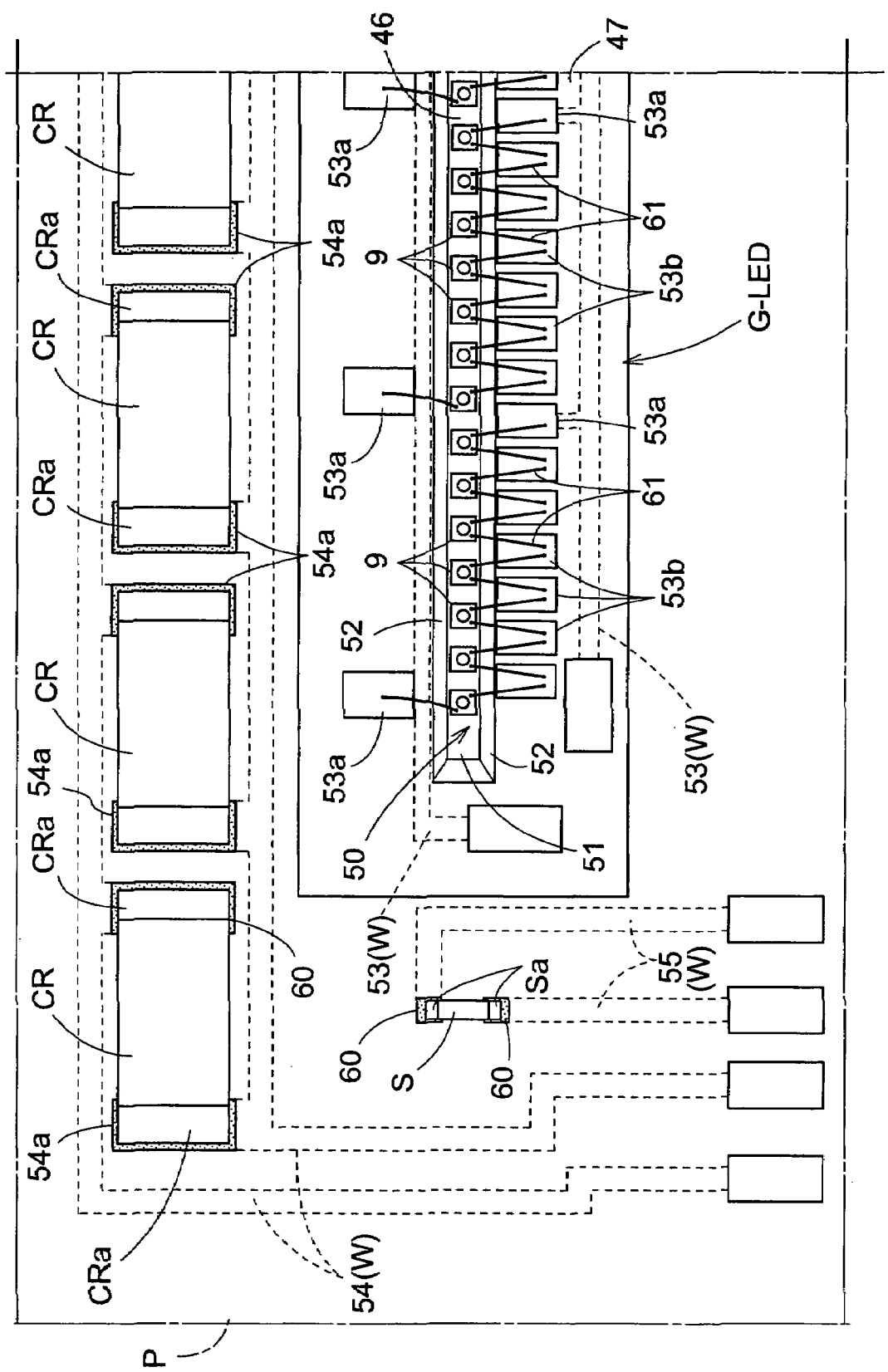
FIG. 7 is a top plan view showing the appearance of the unit after the LED elements are mounted on the printed circuit board.
Figure 8:
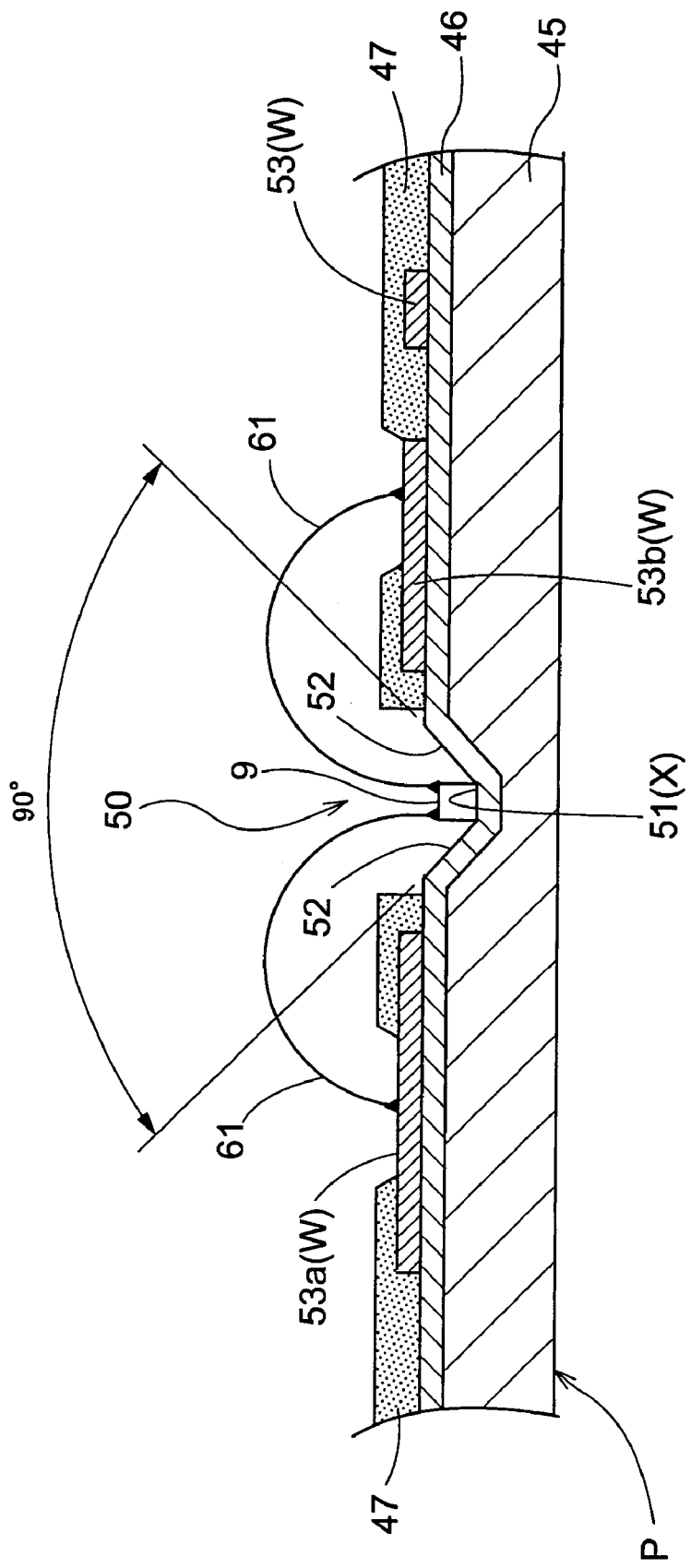
FIG. 8 is a section of an area of the printed circuit board where the LED elements are mounted.

FIG. 6 shows an appearance before surface-mounting the LED elements 9, a reflector unit 50 etc. to the printed circuit board P. FIG. 7 shows an appearance after the surface-mounting. FIG. 8 shows a section of the area mounting the LED elements 9 after the surface mounting operation thereof. As may be clearly seen from FIG. 8 in particular, the rear side and opposed lateral sides of every mounted LED element 9 are surrounded by the ceramic layer 46. Thus, this ceramic layer 46 acts as a reflecting layer for reflecting the beam emitted from the LED element 9. Therefore, for realizing a reflecting face having superior reflecting performance, it is desired to select a ceramic material having superior reflecting property, as the insulating material to be coated on the surface of the metal substrate 45 or to select an appropriate coating method which provides a maximum mirror-like surface.

Further, in case no ceramic coating is to be provided in the groove 50, it is possible to select an appropriate surface working technique for use in the working of this groove 50 which technique provides a surface roughness providing sufficient reflecting property or to effect plating on the inside of the groove 50 for obtaining better reflecting performance.

As may be apparent from FIG. 8, when the LED elements 9 are mounted on the bottom face 51 of the groove 50, the elements 9 are entirely accommodated within the groove 50, so that the beam emitted from the LED elements 9 can escape only from the aperture of this groove 50.

As described hereinbefore, in the instant embodiment, the lateral faces 25 of the groove 50 are formed as the 45-degree inclined faces for forming the upper aperture angle of 90 degrees therebetween. For obtaining even better reflecting performance, these lateral faces 52 can be formed as curved faces for together forming a semi-parabolic cross section.

As may be clearly seen from FIG. 7, the printed wiring W includes a light-emitting wiring portion 53 for supplying power to the LED elements 9, a heating wiring portion 54 for supplying power to the chip resistors CR and a metering wiring portion 55 for applying a potential to a chip thermistor S acting as a temperature metering means. The LED array LED includes a plurality of units of LED elements 9, each unit consisting of seven LED elements electrically serially connected to each other. The light emitting wiring portion 53 includes power terminals 53*a* each supplying power to one unit of LED elements 9, and relay terminals 53*b* formed independently thereof along the array direction of the LED elements 9. The heating wiring portion 54 includes terminals 54*a* to be connected by solder 60 with opposed electrodes CRa of the chip resistors CR. Further, the metering wiring portion 55 includes terminals which are connected by solder 60 with opposed electrodes Sa of the thermistor S.

FIG. 9 shows a light-emitting diode light source unit relating to a further embodiment. In this embodiment, the printed circuit board P consists of a first printed circuit board Pu and a second printed circuit board Po superposed on the top face of the first printed circuit board Pu. In the second printed circuit board Po, by implementing a groove forming technique, a linear straight through (bottomless) groove 150 is formed and this groove when formed exposes the LED array LED comprising the plurality of LED elements 9 mounted in the form of an array of the LED elements 9 on the mounting face of the first printed circuit board Pu exposed through the groove 150.

Figure 10:
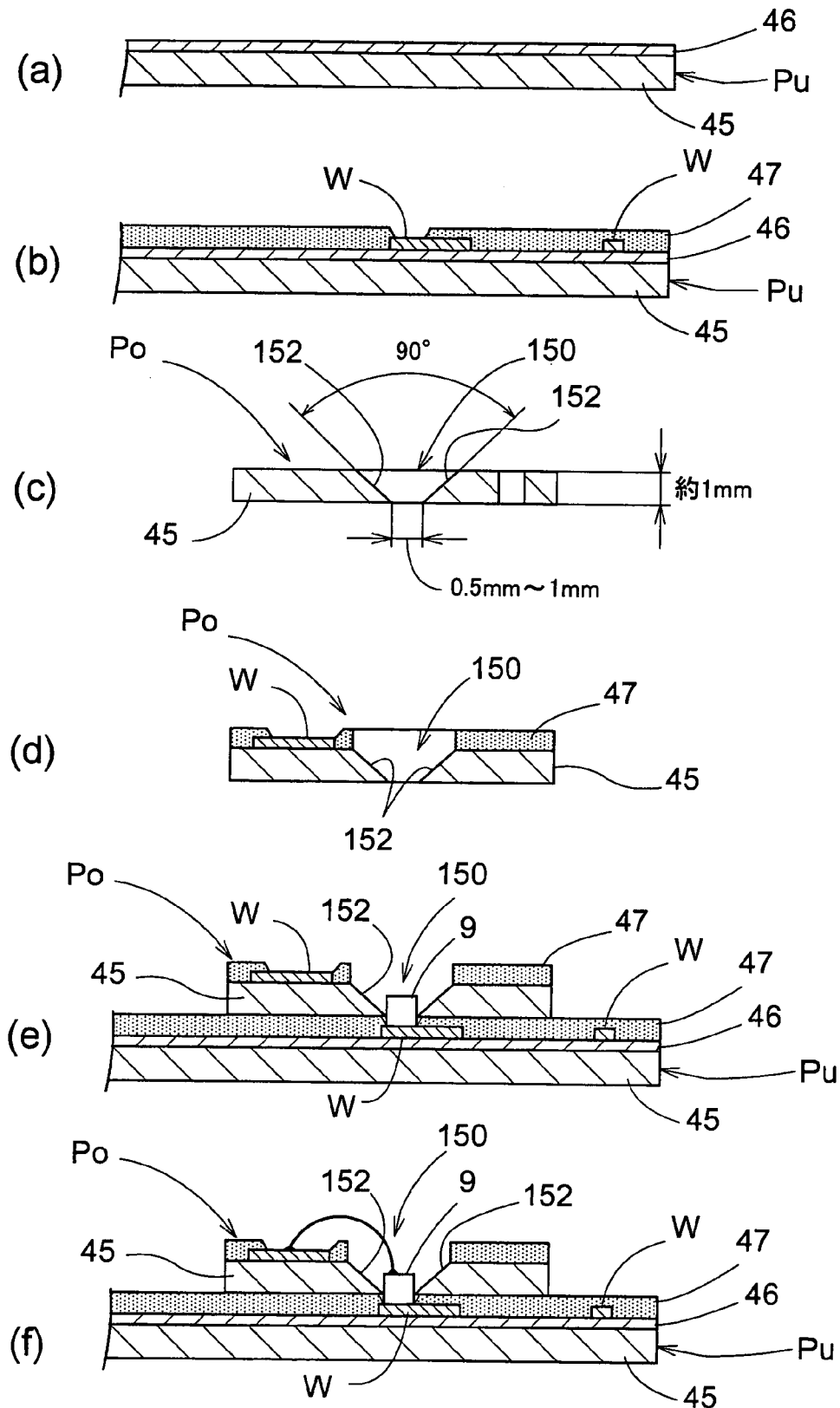
FIG. 10 is a schematic illustrating a process of fabricating the light-emitting diode light source unit relating to the further embodiment of the present invention.

Next, the construction of the printed circuit board P of this type will be described in greater details with reference to FIG. 10. FIG. 10 illustrates a manufacturing process of the printed circuit board P and a process of surface-mounting parts thereon. These processes are only illustrative, not limitative for the present invention.

First, by implementing a groove forming technique on the surface of the aluminum substrate 45, there is prepared the first printed circuit board Pu having an insulating ceramic layer 46 on the surface thereof. (FIG. 10(*a*)). After the printed circuit wiring W formed of a copper foil, a gold foil or the like is formed on this first printed circuit board Pu, a resist film 47 of an insulating resin material is formed on the top surface of the printed circuit board P (FIG. 10(*b*)).

At the same time, in the substrate 45 (this may not necessarily be formed of aluminum) of the second printed circuit board Po, the through groove 150 acting as a beam emitting opening for the LED array LED is formed through the thickness of the board. This through groove 150 has a length corresponding to the length of the LED array LED. As this substrate 45 has a thickness of about 1 mm, the depth of the through groove 150 is about 1 mm, and a bottom opening of the through groove 150 has a width of 0.5 mm to 1 mm. This through groove 150 has an inverse trapezoidal cross section and lateral faces 152 formed as 45-degree inclined faces for forming an upper aperture angle of 90 degrees therebetween (see FIG. 10(*c*)).

If necessary, a printed circuit wiring W is formed by a copper foil, a gold foil etc. on the surface of this second printed circuit board Po as well and a resist film 47 of an insulating resin layer is formed on the top surface of the printed circuit board P (FIG. 10(*d*)).

Thereafter, the second printed circuit board Po is superposed on the first printed circuit board Pu so that the wiring land array as the mounting face for the LED array LED may be registered or aligned with the bottom opening of the through groove 150 and then the boards are fixedly connected with each other by e.g. screws (FIG. 10(*e*)).

To the LED element mounting face (wiring land W) of the first printed circuit board Pu of the printed circuit board P fabricated in the manner described above, the LED elements 9 are die-bonded through the through groove 150 of the second printed circuit board Po. Further, bonding wires 61 are provided for establishing electrical connection between the terminals extending from the upper faces of the LED elements and the printed circuit wiring W of the second printed circuit board Po (FIG. 10(*f*)).

With the above, opposed sides of each LED element 9 mounted on the first printed circuit board Pu are surrounded entirely by the lateral faces 152 of the through groove 150, so that the beam emitted from the LED element 9 can exit only through the top aperture or opening of this through groove 150. In this, the lateral faces 152 of the through groove 150 function as reflecting faces for the beam emitted from the LED element 9. Therefore, for realizing a reflecting face having superior reflecting performance, it may be possible to employ a surface working technique for obtaining surface roughness that provides a maximum mirror-like surface. Or, it is also possible to effect plating on the inside of the through groove for obtaining better reflecting performance. Needless to say, if the second printed circuit board Po also includes a ceramic layer like the first printed circuit board Pu, this layer may be utilized as a reflecting layer.

In this further embodiment too, the lateral faces 152 of the through groove 150 are formed as the 45-degree inclined faces for forming the upper aperture angle of 90 degrees therebetween. For obtaining even better reflecting performance, these lateral faces 152 too can be formed as curved faces for together forming a semi-parabolic cross section.

In addition to the foregoing embodiments, the light-emitting diode light source unit according to the present invention can be used also as a light source for use in an electrostatic copier, a flat bed scanner, etc.

The present invention may be embodied in any other manner than described above. Various modifications thereof will be apparent for those skilled in the art without departing from the essential concept thereof defined in the appended claims.

What is claimed is:

1. A light source unit comprising:
   a printed circuit board including:
      a first printed circuit board, and
      a second printed circuit board superposed on a top face of the first printed circuit board;
   a straight through groove formed in the second printed circuit board;
   a mounting face formed in the first printed circuit board to be exposed through the through groove;
   a plurality of light emitting diode (LED) elements arranged in the form of an array and mounted on the mounting face;
   wherein a lateral face of the through groove acts as a reflecting face for reflecting a beam from said each light-emitting diode element toward an object to be illuminated.

2. The light source unit of claim 1, wherein said lateral face of the through groove is formed as an inclined face flared open from the bottom face.

3. The light source unit of claim 1, wherein the light source unit is for use in a color film scanner and the unit includes a plurality of the LED arrays for red, blue and green colors.

* * * * *